US008685165B2

(12) United States Patent
Rahtu et al.

(10) Patent No.: US 8,685,165 B2
(45) Date of Patent: *Apr. 1, 2014

(54) METAL OXIDE FILMS

(75) Inventors: Antti Rahtu, Helsinki (FI); Raija Matero, Vantaa (FI); Markku Leskela, Espoo (FI); Mikko Ritala, Espoo (FI); Timo Hatanpaa, Espoo (FI); Timo Hanninen, Helsinki (FI); Marko Vehkamaki, Helsinki (FI)

(73) Assignee: ASM International N.V. (NL)

( * ) Notice: Subject to any disclaimer, the term of this patent is extended or adjusted under 35 U.S.C. 154(b) by 333 days.

This patent is subject to a terminal disclaimer.

(21) Appl. No.: 11/864,677

(22) Filed: Sep. 28, 2007

(65) Prior Publication Data

US 2008/0072819 A1    Mar. 27, 2008

Related U.S. Application Data

(63) Continuation of application No. 11/317,656, filed on Dec. 22, 2005, which is a continuation-in-part of application No. 09/787,062, filed on Jun. 28, 2001, now Pat. No. 7,108,747.

(30) Foreign Application Priority Data

Sep. 11, 1998  (FI) .......................... 981959
Sep. 13, 1999  (WO) ................. PCT/FI99/00741

(51) Int. Cl.
     *C30B 21/02*  (2006.01)
(52) U.S. Cl.
     USPC .............. 117/105; 117/84; 117/104; 117/108
(58) Field of Classification Search
     USPC ................ 117/86, 104, 105, 99, 108
     See application file for complete search history.

(56) References Cited

U.S. PATENT DOCUMENTS

| 4,058,430 | A  | 11/1977 | Suntola et al. |
| 4,927,670 | A  | 5/1990  | Erbil |
| 5,225,561 | A  | 7/1993  | Kirlin et al. |
| 5,496,582 | A  | 3/1996  | Mizutani et al. |
| 5,617,290 | A  | 4/1997  | Kulwicki et al. |
| 5,711,811 | A  | 1/1998  | Suntola et al. |
| 6,087,257 | A  | 7/2000  | Park et al. |
| 6,099,904 | A  | 8/2000  | Mak et al. |
| 6,583,057 | B1 | 6/2003  | Alluri et al. |
| 6,780,704 | B1 | 8/2004  | Raaijmakers et al. |
| 6,800,567 | B2 | 10/2004 | Cho |

(Continued)

FOREIGN PATENT DOCUMENTS

| EP | 344 352  B1 | 12/1989 |
| FI | 108375  B   | 1/2002  |

OTHER PUBLICATIONS

*Advances in Organometallic Chemistry*, Ed. Stone and West, vol. 40, Academic Press (1996).

(Continued)

*Primary Examiner* — Bob M Kunemund
(74) *Attorney, Agent, or Firm* — Knobbe, Martens Olson & Bear, LLP

(57) ABSTRACT

Atomic layer deposition (ALD) type processes for producing titanium containing oxide thin films comprise feeding into a reaction space vapor phase pulses of titanium alkoxide as a titanium source material and at least one oxygen source material, such as ozone, capable of forming an oxide with the titanium source material. In preferred embodiments the titanium alkoxide is titanium methoxide.

22 Claims, 8 Drawing Sheets

(56) References Cited

U.S. PATENT DOCUMENTS

| | | |
|---|---|---|
| 2001/0024387 A1 | 9/2001 | Raaijmakers et al. |
| 2002/0142588 A1 | 10/2002 | Basceri et al. |
| 2002/0153579 A1 | 10/2002 | Yamamoto |
| 2003/0176047 A1 | 9/2003 | Doan et al. |
| 2004/0125541 A1 | 7/2004 | Chung |
| 2005/0271813 A1 | 12/2005 | Kher et al. |

OTHER PUBLICATIONS

Bedair, S.M., "Atomic Layer Epitaxy Deposition Processes," *J. Vac. Sci Technol.* B 12(1), Jan./Feb. 1994, pp. 179-185.

Bilodeau et al., "MOCVD BaSrTiO$_3$ for ≥1-Gbit DRAMs," *Solid State Technology*, pp. 235-242 (Jul. 1997).

Huang, et al. "Preparation of Characterization of Thin Films of MgO, Al$_2$O$_3$ and MgAl$_2$O$_4$ by Atomic Layer Deposition", *Journal of Electronic Materials*, vol. 22, No. 2 (1993).

Huang et al. "The surface morphology of atomic layer deposited magnesia", *Journal of Materials Science* Letters 12, pp. 1444-1446, Chapman & Hall (1993).

Iiskola, et al. "Functional surface groups for single-site heterogeneous α-olefin polymerization catalysts", *Applied Surface Science* 121/122 , pp. 373-377, Elsevier Science B.V. (1997).

Kang et al., "Deposition Characteristics of (Ba, Sr) TiO$_3$ Thin Films by Liquid Source Metal-Organic Chemical Vapor Deposition at Low Substrate Temperatures," *Jpn. J. Appl. Phys.*, vol. 36, pp. 6946-6952 (1997).

Kiyotoshi et al., "Chemical Vapor Deposition of High Quality (Ba, Sr)TiO$_3$ Thin Films Using Individual Vaporizing Liquid Source Supply System," *Electrochemical Society Proceedings*, vol. 97-25, pp. 1063-1070 (1997).

Martenson et al., "Halide chemical vapour deposition of Bi$_2$Sr$_2$CaCu$_2$O$_{8+x}$: aspects of epitaxy," *Journal of Crystal Growth*, vol. 156, pp. 67-73 (1995).

Nakano et al., "Digital Chemical Vapor Deposition of SiO$_2$," *Appl. Phys. Lett.* 57 (11), Sep. 10, 1990, pp. 1096-1098.

Niinistö et al., "Synthesis of oxide thin films and overlayers by atomic layer epitaxy for advanced applications," *Materials Science & Engineering*, vol. B41, pp. 23-29 (1996).

Putkonen, et al. "Enhanced growth rate in atomic layer epitaxy deposition of magnesium oxide thin films", *Journal of Materials Chemistry*, pp. 1857-1861, The Royal Society of Chemistry (2000).

Ritala et al., "Growth of titanium dioxide thin films by atomic layer epitaxy," *Thin Solid Films*, vol. 225, pp. 288-295 (1993).

Ritala et al., "Titanium Isopropoxide as a Precursor in Atomic Layer Epitaxy of Titanium Dioxide Thin Films," *Chem. Mater.*, vol. 5, pp. 1174-1181 (1993).

Ritala et al., "Atomic Layer Epitaxy Growth of Titanium Dioxide Thin Films from Titanium Ethoxide," *Chem. Mater.*, vol. 6, pp. 556-561 (1994).

Ritala, et al. "Atomic Layer Deposition", *Handbook of Thin Film Materials*, vol. 1: Deposition and Processes of Thin Films, Chapter 2, pp. 103-159, Academic Press (2002).

Schulz et al., "MOCVD Routes to Thin Metal Oxide Films for Superconducting Electronics," *Adv. Mater.*, vol. 6, No. 10, pp. 719-730 (1994).

Sheppard, "Advances in Processing of Ferroelectric Thin Films," *Ceramic Bulletin*, vol. 71, No. 1, (1992).

Suntola, "Atomic Layer Epitaxy", *Handbook of Crystal Growth 3, Thin Films and Epitaxy*, Part B: Growth Mechanisms and Dynamics, Chapter 14, pp. 601-663, Elsevier Science B. V. 1994.

Suntola, "Atomic Layer Epitaxy," *Thin Solid Films*, vol. 216, pp. 84-89 (1992).

Vehkamäki et al., "Growth of SrTiO$_3$ and BaTiO$_3$ Tin Films by Atomic Layer Deposition," *Electrochemical and Solid-State Letters*, 2 (10) pp. 504-506 (1999).

Wojtczak et al., "A Review of Group 2 (Ca, Sr, Ba) Metal-Organic Compounds as Precursors for Chemical Vapor Deposition," *Advances in Organometallic Chemistry*, vol. 40, pp. 215-340 Academic Press (1996).

Huang et al., "Temperature-dependence of the growth orientation of atomic layer growth MgO", *Appl. Phys. Lett.* 61 (12); pp. 1450-1452 (Sep. 1992).

Alt, *J. of Organometallic Chemistry*, 391 (1990), p. 53-60 and English translation.

Niinisto, *J. of Applied Physics*, vol. 95, No. 1 (Jan. 2004), p. 84.

Putkonen, *J. Mater. Chem.*, vol. 11, 2001, p. 3141-3147.

METAL OXIDE FILMS

CROSS-REFERENCE TO RELATED APPLICATIONS

This application claims priority as a continuation of U.S. application Ser. No. 11/317,656, filed Dec. 22, 2005, which is a continuation-in-part of U.S. application Ser. No. 09/787,062, filed Jun. 28, 2001 (now U.S. Pat. No. 7,108,747, issued Sep. 19, 2006), which is the U.S. national phase of International Application No. PCT/FI99/00741, filed Sep. 13, 1999, which claims priority from Finland Patent Application No. 981959, filed Sep. 11, 1998. The priority applications are incorporated by reference herein in their entireties.

BACKGROUND OF THE INVENTION

1. Field of the Invention

This invention relates generally to processes for depositing titanium-containing oxide films. Certain embodiments relate to processes for manufacturing titanium-containing oxide thin films by atomic layer deposition using volatile titanium compounds as source materials.

2. Description of the Related Art

Atomic layer deposition ("ALD") refers to vapour deposition-type methods in which a material, typically a thin film, is deposited on a substrate from vapour phase reactants. It is based on sequential self-saturating surface reactions. ALD is described in detail in U.S. Pat. Nos. 4,058,430 and 5,711,811, incorporated herein by reference. ALD reactors benefit from the use of inert carrier and purging gases, which makes the system fast.

According to the principles of ALD, the reactants (also referred to as "source chemicals" or "precursors") are separated from each other, typically by inert gas, to prevent gas-phase reactions and to enable the above-mentioned self-saturating surface reactions. Surplus chemicals and reaction by-products are removed from the reaction chamber by purging with an inert gas and/or evacuating the chamber before the next reactive chemical pulse is introduced. Undesired gaseous molecules can be effectively expelled from the reaction chamber by keeping the gas flow speeds high with the help of an inert purging gas. The purging gas pushes the extra molecules towards the vacuum pump used for maintaining a suitable pressure in the reaction chamber. ALD provides controlled film growth as well as outstanding conformality.

Titanium containing oxides are technologically very important and they have a variety of industrially useful properties. They function well, for example, as semiconductors, insulators and ferroelectrics. $TiO_2$ has a high permittivity of around 70. $BaTiO_3$ and $SrTiO_3$ have permittivities of several hundreds. Titanium also has several technologically important ternary compounds, such as $BiTiO_3$ and $PbTiO_3$. Pure $TiO_2$ is usually oxygen deficient and thus semiconducting. Semiconducting $TiO_2$ has been used, for example, in solar cells and self-cleaning coatings.

Alkaline earth metals (such as Ba and Sr) easily form stable non-volatile halides. Therefore, halide-containing precursors of these metals are not generally useful in depositing oxides such as $SrTiO_3$ and $BaTiO_3$ by ALD. In addition, alkaline earth metals easily form hydroxides. As a result, ALD using water as an oxygen source can be problematic, requiring long purge times and/or high temperatures. However, long purge times effectively impair the productivity of these processes. Further, it can be difficult to find a deposition temperature that will not cause decomposition of the precursors and will keep the thin film atoms intact, but will still keep the precursors in gaseous phase and provide the activation energy for the surface reactions.

SUMMARY OF THE INVENTION

In one aspect atomic layer deposition processes for producing titanium-containing oxide thin films are provided. The processes preferably comprise alternately contacting a substrate in a reaction space with vapor phase pulses of a titanium alkoxide reactant, such as a titanium methoxide compound and at least one oxygen source material capable of forming an oxide with the titanium. In some embodiments, the titanium methoxide is $Ti(OMe)_4$. Preferably, the oxygen source material is ozone. However, in some embodiments the oxygen source material is selected from the group consisting of water, oxygen, hydrogen peroxide, aqueous solutions of hydrogen peroxide, ozone, oxides of nitrogen, halide-oxygen compounds, peracids (—O—O—H), alcohols, alkoxides, oxygen-containing radicals and mixtures thereof.

In some embodiments, ternary and other multicomponent oxide films are deposited by providing a second metal source material, preferably comprising at least one transition metal or main group metal, followed by provision of an oxygen source material.

In some embodiments, the deposition temperature is preferably between about 100° C. and about 300° C.

In another aspect, multicomponent oxide thin films comprising titanium are deposited by atomic layer deposition type processes. The processes preferably comprise contacting a substrate with alternate and sequential vapour phase pulses of a metal precursor and an oxygen source material, where the metal precursor is preferably a titanium alkoxide compound and the oxygen source material is preferably ozone. The titanium alkoxide compound may be, for example, a titanium methoxide compound. In some embodiments the multicomponent oxide film comprises titanium, barium and strontium.

In a further aspect, methods are provided for depositing a multicomponent oxide film comprising barium and strontium by repeating a first, second and third growth cycle. The first growth cycle preferably comprises contacting a substrate in a reaction chamber with a titanium methoxide compound, removing excess titanium methoxide, contacting the substrate with ozone and removing excess ozone from the reaction chamber. In the second and third deposition cycles, the substrate is alternately contacted with a barium or strontium compound, respectively, and an oxygen source material, such as ozone. The cycles may be repeated in equivalent numbers. In other embodiments, the ratio of cycles is varied to achieve the desired film composition, as will be apparent to the skilled artisan.

BRIEF DESCRIPTION OF THE DRAWINGS

in FIG. 1a, at 250° C. in FIG. 1b, at 300° C. in FIG. 1c, at 150° C. in FIG. 1d, at 200° C. in FIG. 1e, at 250° C. in FIG. 1f and at 300° C. in FIG. 1g.

DETAILED DESCRIPTION

Figure 1A:
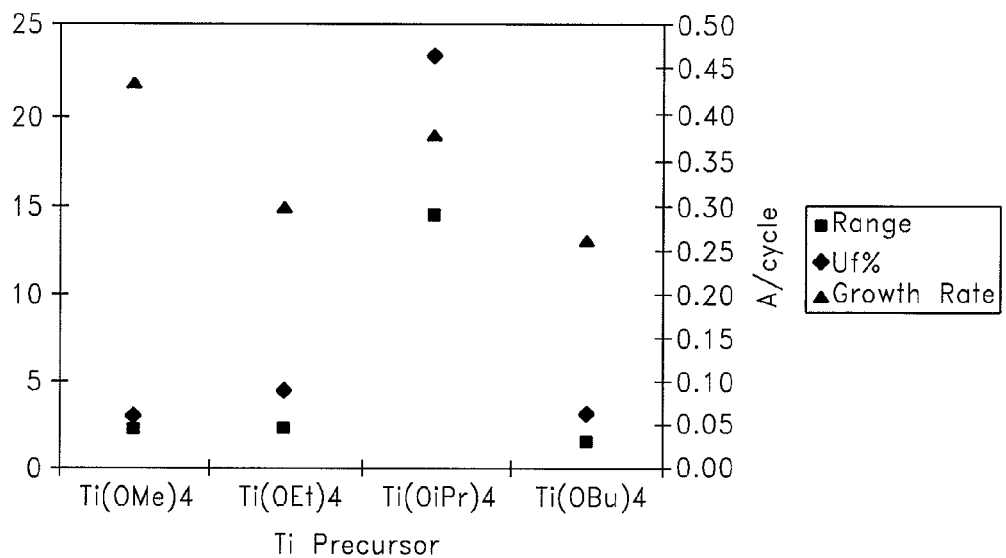
FIGS. 1a-g are graphical presentations of the range, uniformity and growth rate of titanium oxide films deposited at temperatures of 100-300° C. using titanium alkoxides as the titanium source material and water (FIGS. 1a-1c) or ozone (FIGS. 1d-1g) as the oxidant. Deposition was carried out at 200° C.
Figure 1B:
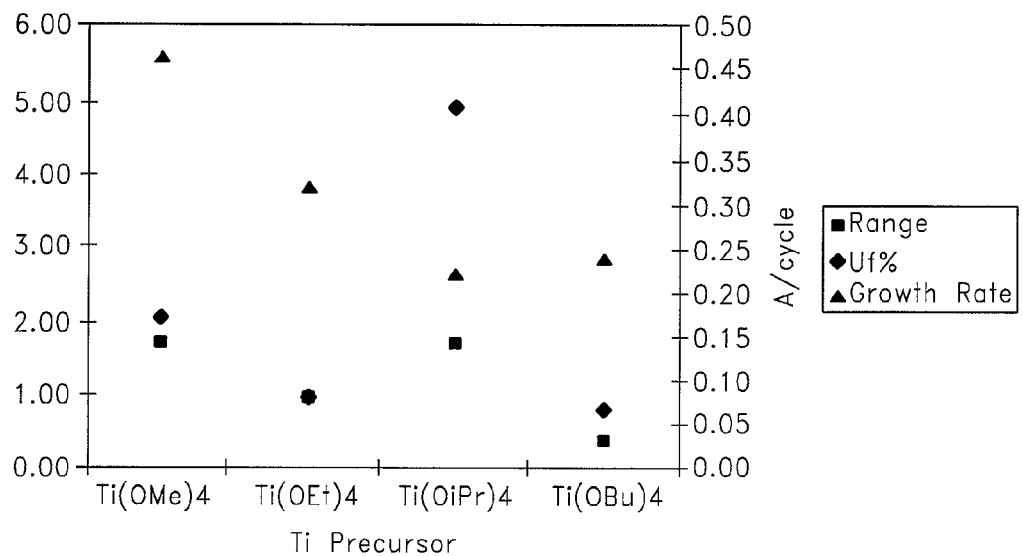
Figure 1C:
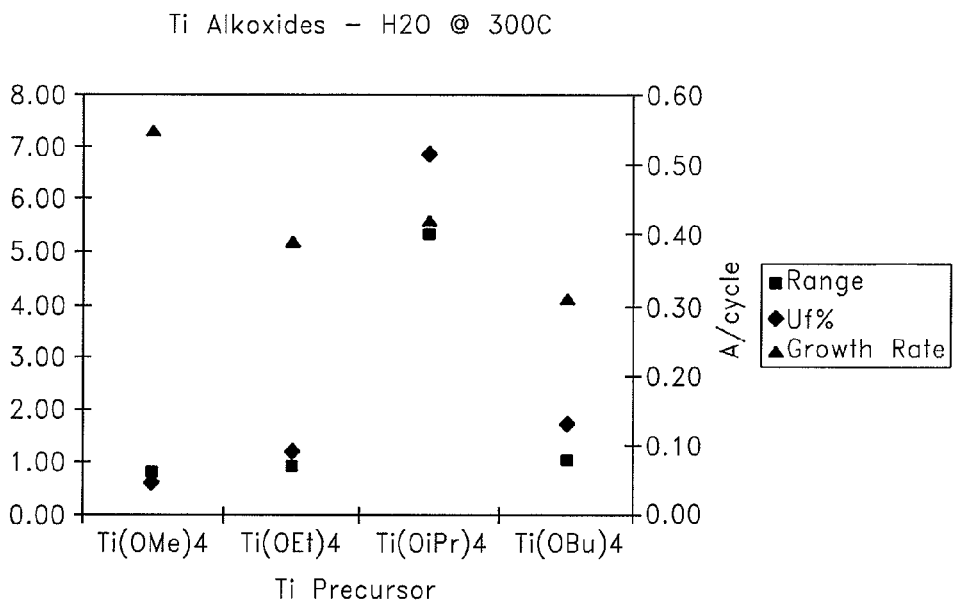
Figure 1D:
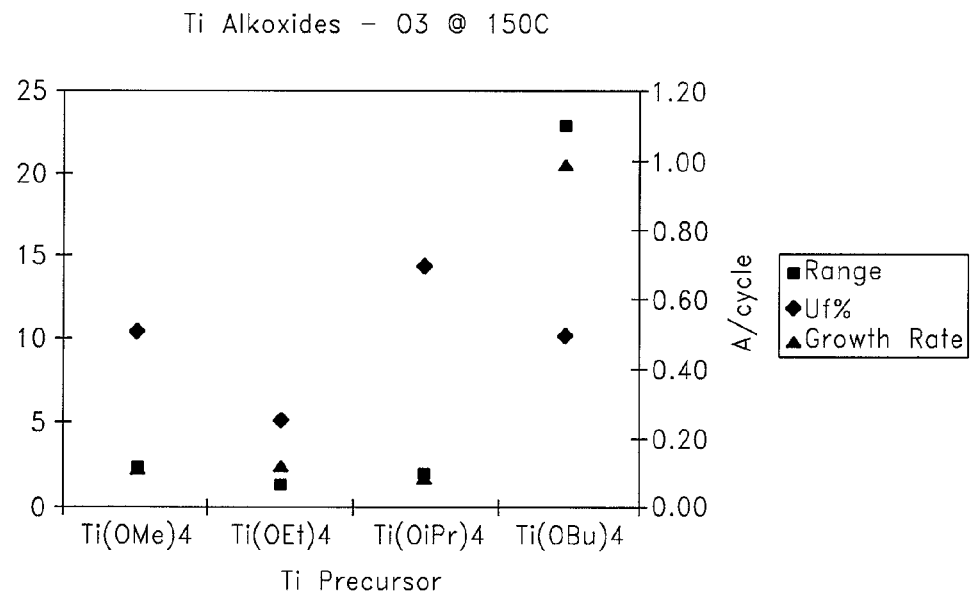
Figure 1E:
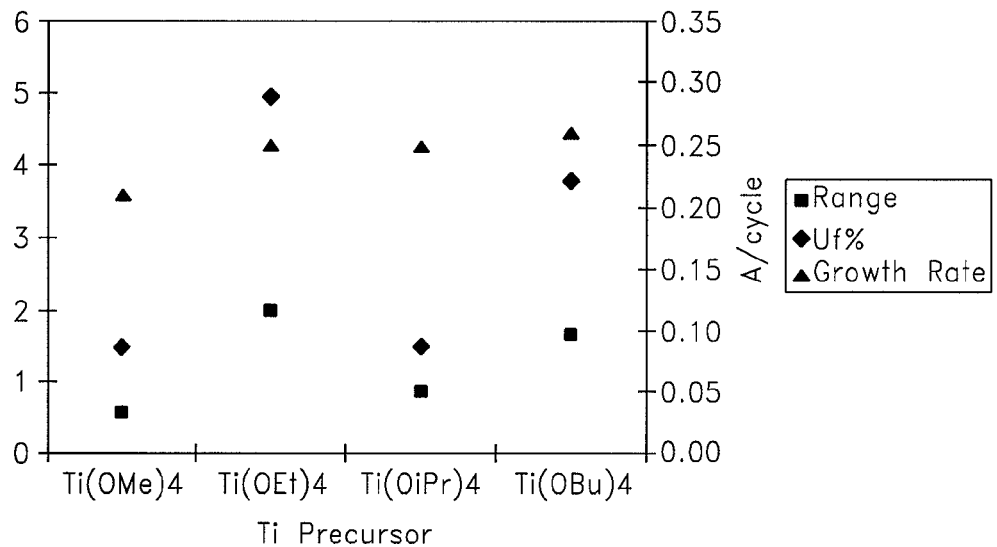
Figure 1F:
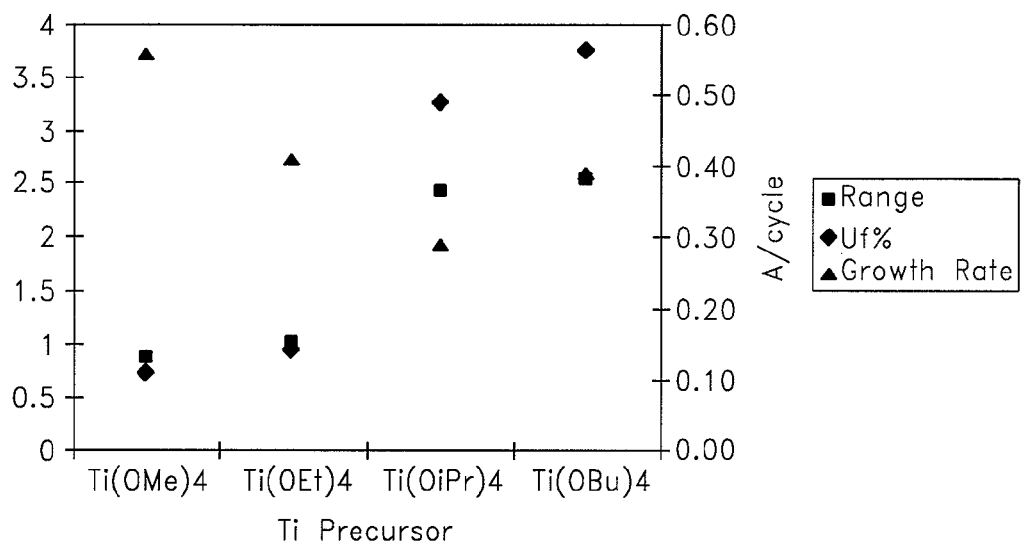
Figure 1G:
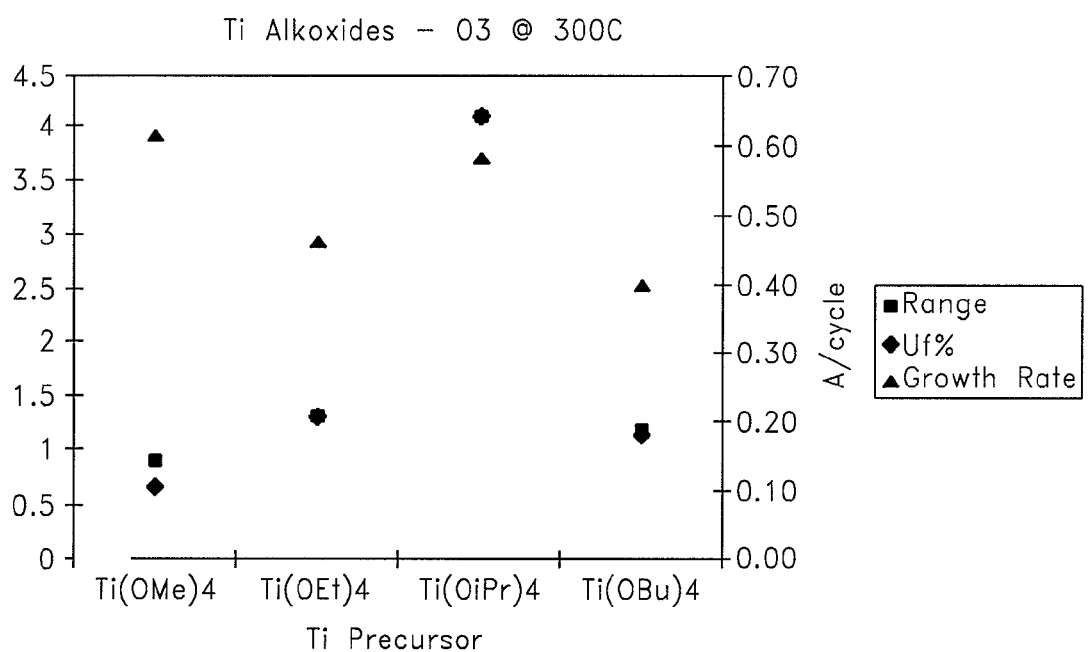

In context of the present invention, "an ALD type process" generally refers to a process for depositing thin films on a substrate molecular layer by molecular layer. This controlled deposition is made possible by self-saturating chemical reactions on the substrate surface. Gaseous reactants are conducted alternately and sequentially into a reaction chamber and contacted with a substrate located in the chamber to provide a surface reaction. Typically, a pulse of a first reactant is provided to the reaction chamber where it chemisorbs to the substrate surface in a self-limiting manner. Excess first reactant is then removed and a pulse of a second reactant is provided to the reaction chamber. The second reactant reacts with the adsorbed first reactant, also in a self-limiting manner. Excess second reactant and reaction by-products, if any, are removed from the reaction chamber. Additional reactants may be supplied in each ALD cycle, depending on the composition of the thin film being deposited.

The pressure and the temperature of the reaction chamber are adjusted to a range where physisorption (i.e. condensation of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as Å/pulsing cycle, depends, for example, on the number of available reactive surface sites on the surface and bulkiness of the reactant molecules.

Gas phase reactions between precursors and any undesired reactions with by-products are preferably inhibited or prevented. Reactant pulses are separated from each other and the reaction chamber is purged with the aid of an inactive gas (e.g. nitrogen or argon) and/or evacuated between reactant pulses to remove surplus gaseous reactants and reaction by-products from the chamber. The principles of ALD type processes have been presented by the inventor of the ALD technology, Dr T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

An extensive description of ALD precursors and ALD-grown materials has been presented by Prof. M. Ritala and Prof. M. Leskelä in a recent review article, Handbook of Thin Film Materials, Vol. 1: Deposition and Processing of Thin Films, Chapter 2 "Atomic Layer Deposition", pp. 103-159, Academic Press 2002, incorporated by reference herein.

In context of the present application "a reaction space" designates generally a reaction chamber, or a defined volume therein, in which the conditions can be adjusted so that deposition of a thin film is possible.

In context of the present application, "an ALD type reactor" is a reactor where the reaction space is in fluid communication with an inactive gas source and at least one, preferably at least two precursor sources such that the precursors can be pulsed into the reaction space. The reaction space is also preferably in fluid communication with a vacuum generator (e.g. a vacuum pump), and the temperature and pressure of the reaction space and the flow rates of gases can be adjusted to a range that makes it possible to grow thin films by ALD type processes.

As is well known in the art, there are a number of variations of the basic ALD method, including PEALD (plasma enhanced ALD) in which plasma is used for activating reactants. Conventional ALD or thermal ALD refers to an ALD method where plasma is not used but where the substrate temperature is high enough for overcoming the energy barrier (activation energy) during collisions between the chemisorbed species on the surface and reactant molecules in the gas phase so that up to a molecular layer of thin film grows on the substrate surface during each ALD pulsing sequence or cycle. For the purpose of the present invention, the term "ALD" covers both PEALD and thermal ALD.

"Metal source material" and "metal precursor" are used interchangeably to designate a volatile or gaseous metal compound that can be used in an ALD process. Preferred metal source materials and metal precursors can be used as a starting compound for the corresponding metal oxide.

The term "multicomponent oxide" covers oxide materials comprising at least two different metal cations.

According to preferred embodiments, titanium oxide containing thin films are deposited by ALD using titanium alkoxide precursors, more preferably the specific alkoxide precursor Ti(OMe)$_4$.

In a preferred ALD type process, a gas phase pulse of an evaporated titanium alkoxide compound, preferably an evaporated titanium methoxide compound, is introduced into the reaction space of an ALD reactor, where it is contacted with a suitable substrate. No more than a monolayer of the titanium alkoxide compound adsorbs to the substrate surface in a self-limiting manner. Excess titanium alkoxide compound is removed from the reaction space by purging and/or evacuating the chamber.

Subsequently, a gas phase pulse of an oxygen source material is introduced into the reaction space, where it reacts with the adsorbed titanium precursor in a self-limiting manner. The oxygen source material is preferably selected from the group consisting of water, oxygen, hydrogen peroxide, aqueous solution of hydrogen peroxide, ozone, oxides of nitrogen, halide-oxygen compounds, peracids (—O—O—H), alcohols, alkoxides, oxygen-containing radicals and mixtures thereof. In preferred embodiments, ozone is used as the oxygen source material, since it does not form hydroxides with the alkaline earth materials.

By alternating the provision of the titanium precursor and the oxygen source material, a titanium oxide thin film can be deposited. A growth rate of about 0.10 to 0.20 Å/cycle is typically achieved in ALD processes. However, when TiO$_2$ was grown from titanium methoxide and ozone a growth rate of 0.55 Å/c was achieved at 250° C.

Optionally, an inactive gas can be used as a carrier gas during deposition. Inactive gas may also be used to purge the reaction chamber of excess reactant and reaction by-products, if any, between reactant pulses.

The deposition can be carried out at normal pressure, but it is preferred to operate the process at reduced pressure. Thus, the pressure in the reactor is typically 0.01-20 mbar, preferably 0.1-5 mbar.

The reaction temperature can be varied depending on the evaporation temperature and the decomposition temperature of the precursor. In some embodiments the range is from about 100 to 400° C., in particular about 180 to 380° C. The substrate temperature is preferably low enough to keep the bonds between thin film atoms intact and to prevent thermal decomposition of the gaseous reactants. On the other hand, the substrate temperature is preferably high enough to keep the source materials in gaseous phase and avoid condensation. Further, the temperature is preferably sufficiently high to provide the activation energy for the surface reaction. In preferred embodiments the deposition temperature is preferably between about 100 and about 300° C. It is particularly preferred to grow titanium oxide films from titanium methoxide at temperatures of about 100-300° C., more preferably at about 250° C.

Figure 2:
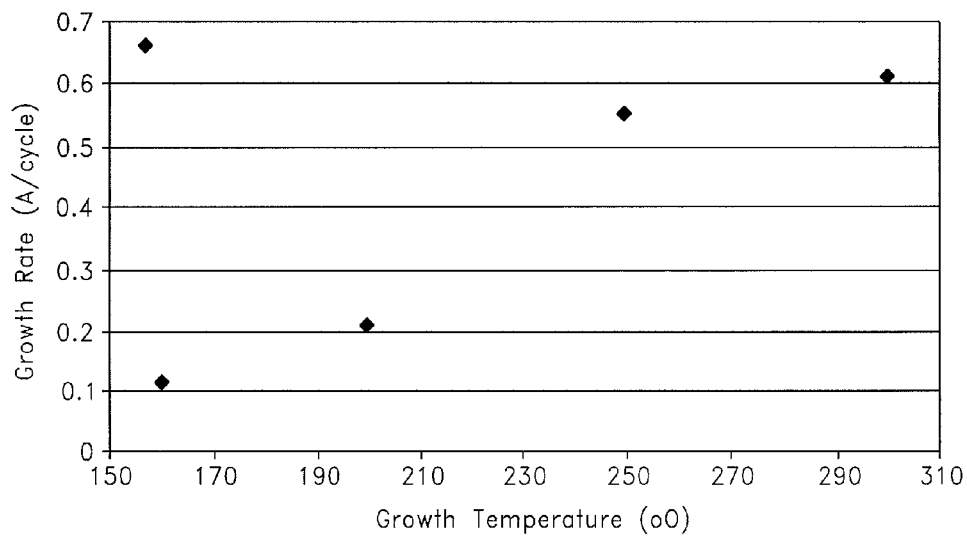
FIG. 2 is a graphical presentation of the growth rate as a function of the growth temperature (deposition temperature). The titanium source chemical was $Ti(OMe)_4$ and the oxidant was ozone. A 200 mm wafer was measured at 49 points.
Figure 3:
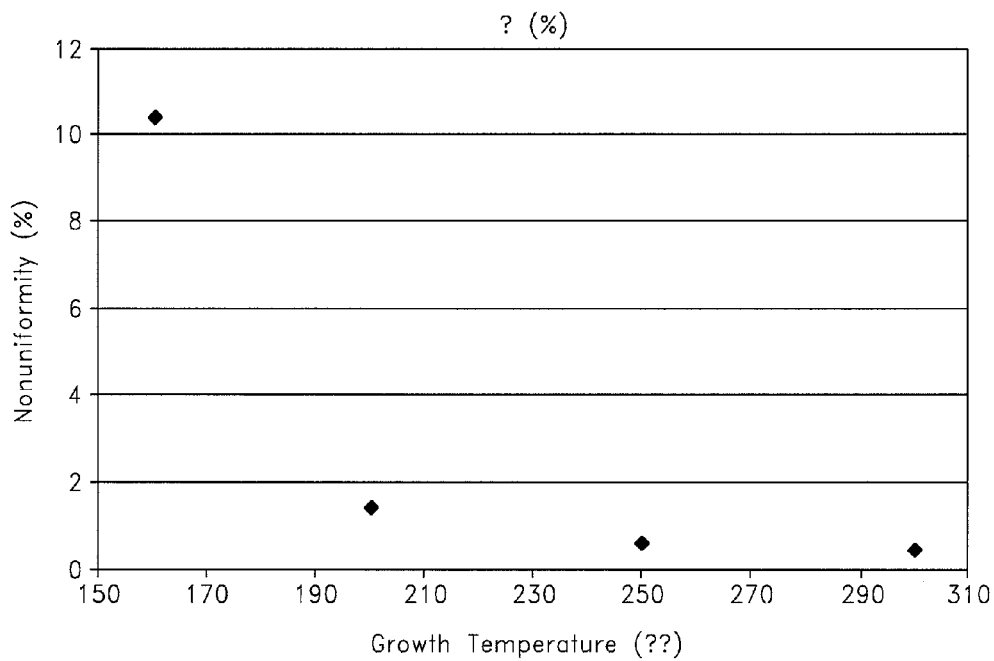
FIG. 3 is a graphical presentation of the film nonuniformity as a function of growth temperature. The titanium source was Ti(OMe)$_4$ and the oxidant wa ozone. A 200 mm wafer was measured at 49 points.

The titanium source temperature is preferably about 120 to 170° C., more preferably about 140° C. In preferred embodiments, the reaction temperature is somewhat higher than the titanium source temperature, typically about 20 to 160° C. higher. In the examples described below, maximum relative growth rates were obtained at 250 and 300° C. using titanium methoxide. The best values for the uniformity were also achieved at these temperatures. When the deposition temperature was increased from 160° C. to 250° C. the growth rate increases from 0.1 to 0.55 Å/cycle (see FIG. 2). From a temperature of 250° C. to 300° C. the growth rate stayed at a relatively constant level of about 0.55 to 0.6 Å/cycle. At 160° C. the non-uniformity was about 10%. This reaction temperature is already relatively close to the evaporation temperature of the Ti precursor. At a higher temperature the uniformity reaches lower values, i.e. about 1.5-0.6%.

For further details on the operation of a typical ALD process, reference is made to the documents cited above.

The substrate can be of various types. Examples include, without limitation, silicon, silica, coated silicon, germanium, silicon-germanium alloys, copper metal, noble and platinum metals group including silver, gold, platinum, palladium, rhodium, iridium and ruthenium, nitrides, such as transition metal nitrides, e.g. tantalum nitride TaN, carbides, such as transition metal carbides, e.g. tungsten carbide WC, and nitride carbides, e.g. tungsten nitride carbide $WN_xC_y$. The preceding thin film layer deposited on the substrate, if any, will form the substrate surface for the next thin film.

In order to produce multicomponent oxide films, a second metal source material can be introduced to the ALD process. Additional metal source materials can also be used, depending on the number of metals desired in the thin film. For example, in some embodiments, a third, fourth, fifth etc. . . . metal compound is used. In some preferred embodiments, each additional metal source material is provided in a separate cycle, with each cycle comprising feeding a vapor phase pulse of a metal source material, removing excess metal source material, providing a vapor phase pulse of an oxygen source material and removing excess oxygen source material. The same oxygen source material may be provided after each metal reactant, or different oxidants may be used to oxidize the different metals. The number of cycles for each metal precursor may be approximately equivalent or may be different, depending on the composition of the film that is desired.

In other embodiments, a pulse of the second metal source reactant is the next reactant provided after the titanium source material in the same deposition cycle. An oxidant is then provided to convert the two metals to oxides. Additional metal reactants may also be provided prior to provision of the oxygen containing source material. In other embodiments, an oxidant is provided after each metal source reactant, as discussed above.

In addition, in some embodiments, the second (or additional) metal compound is provided in each ALD cycle. That is, a pulse of the second metal compound is provided for each pulse of the titanium reactant. However, in other embodiments the second metal reactant is provided intermittently in the deposition process. In still other embodiments, a nanolaminate structure is deposited by repeating a first cycle comprising provision of the titanium precursor and a first oxidant to deposit a thin film of titanium oxide, followed by repeating a second cycle comprising provision of the second metal precursor to deposit a thin film of the second metal oxide. The nanolaminate can start and end with either metal, and the thickness of each layer can be determined by the skilled artisan based on the particular circumstances.

Additional metal precursors can be metal compounds comprising a single metal or complex metal compounds comprising two or more metals. The metal compounds are preferably selected from the group of volatile or gaseous compounds of transition metals and main group metals, i.e., elements of groups 1, 2, 3, 4, 5, 6, 7, 8, 9, 10, 11, 12, 13 and/or 14 (according to the system recommended by IUPAC) in the periodic table of elements.

Since the properties of the metal compounds vary, the suitability of each metal compound for use in the ALD processes disclosed herein has to be considered. The properties of the compounds can be found, e.g., in N. N. Greenwood and A. Earnshaw, *Chemistry of the Elements*, 1$^{st}$ edition, Pergamon Press, 1986. The suitability of any particular compound can readily be determined by a skilled artisan.

In some embodiments, preferred second metal source materials are halides, preferably fluorides, chlorides, bromides or iodides, or metal organic compounds, preferably alkoxy, alkylamino, cyclopentadienyl, dithiocarbamate or betadiketonate compounds of the desired metal(s). Also double metal precursors, i.e. molecules containing two metals in a discrete ratio, may be used. In particular embodiments, cyclopentadienyl barium and/or cyclopentadienyl strontium compounds are used.

In some embodiments, barium, strontium, lanthanum and zirconium are used as sources of a second and/or third and/or fourth etc. . . . metal in ternary and other multicomponent oxides. As mentioned above, the second metal source material (and any additional metal reactants) can be oxidized using the same or another oxygen source material as for the titanium precursor.

In a particular embodiment a multicomponent oxide thin film comprises barium, strontium and titanium. The multicomponent oxide film may be BST. The multicomponent oxide is preferably deposited by alternating three deposition cycles, as described above. Thus, in one deposition cycle a vapour phase reactant pulse comprising a titanium compound, preferably a titanium alkoxide compound and more preferably a titanium methoxide compound, is fed into the reaction chamber. Excess titanium compound and reaction by products, if any, are removed from the reaction chamber, preferably with the aid of an inert gas. An oxygen source material, preferably ozone, is then provided to the reaction chamber where it reacts with the chemisorbed titanium compound. In the second cycle a barium compound, preferably a cyclopentadienyl compound, is provided in the reactant pulse. In the third cycle a strontium compound, preferably a cyclopentadienyl strontium compound, is provided in the first reactant pulse. The three cycles may be provided in any order, and the deposition may begin and end with any of the cycles. In addition, one ratio of the cycles may be varied to provide the desired composition, as can be determined by the skilled artisan.

In theory, a stoichiometric oxide $ABO_3$ can be obtained simply by pulsing the two metal precursors and corresponding oxygen sources alternately and the growth rate of the ternary oxide can be predicted by summing the growth rates of the constituent oxides. In practice, however, both assumptions often fail due to the different reactivities of the precursors. The effect of surface chemistry usually causes changes in relative growth rate, which can be determined by comparing the observed film thickness with the theoretical thickness calculated from the growth rates of binary oxides.

The novel thin film oxide deposition processes will find extensive application as semiconductors, insulators and ferroelectrics. In addition, other applications will be apparent to the skilled artisan.

The following non-limiting example illustrates one embodiment of the invention.

Example 1

Four different titanium alkoxides were tested as metal precursors in ALD reactions to deposit $TiO_2$ using $H_2O$ and $O_3$ as oxygen sources. Films were deposited at temperatures of 100-300° C. (see FIGS. 1a-g).

Reactions Using $H_2O$ as the Oxygen Source Material:

a) $TiO_2$ films were deposited at 200-300° C. by ALD using alternate pulses of $Ti(OEt)_4$ as the titanium precursor and water as the oxidant. The growth rate increased from 0.30 to 0.39 Å/cycle with increasing temperature. The film uniformity (Uf % 1σ) varied between 0.98 and 4.43, with the best uniformity being obtained at a deposition temperature of 250° C.

b) $TiO_2$ films were deposited by ALD at deposition temperatures of 200-300° C., using alternating pulses of $Ti(O^iPr)_4$ as the titanium precursor and water as the oxidant. Growth rates were about 0.22-0.42 Å/cycle, with the lowest value being obtained at 250° C. and the highest at 300° C. Film uniformity (Uf % 1σ) at these temperatures was 4.84 and 6.84 respectively. For an unknown reason the film deposited at 200° C. was very non-uniform, having a uniformity of 23.53%.

c) $TiO_2$ films were deposited by ALD at deposition temperatures of 200, 250 and 300° C., using alternating pulses of $Ti(OBu)_4$ as the titanium precursor and water as the oxidant. The growth rates at these temperatures were 0.26, 0.24 and 0.36 Å/cycle respectively. The most uniform films were obtained at 250° C. (Uf%/1σ 0.81), while the Uf % were 3.33 and 1.73 at 200° C. and at 300° C. respectively.

d) For comparison, films were also deposited by ALD using $Ti(OMe)_4$ as the titanium source material. The growth rates, in this case, increased from 0.44 to 0.55 Å/cycle with increasing temperature (200-300° C.). At the same time the uniformity Uf % 1σ decreased from 2.26 to 0.80.

Reactions Using $O_3$ as the Oxygen Source Material:

a) $TiO_2$ films were deposited by ALD at 150-300° C., using alternating pulses of $Ti(OEt)_4$ and $O_3$. The growth rate increased from 0.12 to 0.46 Å/cycle with increasing temperature. At the same time, the film uniformity (Uf % 1σ) decreased from 5.21 to 1.33, with the highest uniformity being obtained at 250° C.

b) $TiO_2$ films were deposited by ALD at 100-300° C., using alternating pulses of $Ti(O^iPr)_4$ and $O_3$. The growth rate was 0.08-0.58 Å/cycle, the lowest value being obtained at 100° C. and the highest value at 300° C. The film uniformity (Uf % 1σ) varied between 1.51 and 14.43, with the highest uniformity being obtained at 200° C. and the lowest at 100° C.

c) $TiO_2$ films were deposited by ALD at 150-300° C., using alternating pulses of $Ti(OBu)_4$ and $O_3$. The growth rate at these temperatures was 0.26-0.99 Å/cycle. The best growth rate was obtained at 150° C. The lowest growth rate was therefore 0.26 Å/cycle, obtained at 200° C., and the highest growth rate was 0.39 Å/cycle, obtained at 300° C. The Uf % 1σ decreased with increasing temperature (200-300° C.) from 3.80 to 1.16, the value obtained at 150° C. being 10.30.

d) For comparison, the growth rate when using $Ti(OMe)_4$ increased with increasing temperature (160-300° C.) from 0.11 to 0.61 Å/cycle. At the same time the Uf % 1σ decreased from 10.43 to 0.65.

Dielectric thin films having high dielectric constants (permittivities) are required in many sub-areas of microelectronics and optoelectronics. In particular, the continual decrease in the size of microelectronics components has increased the need for the use of such dielectric films. For example, the capacitance of DRAM (Dynamic Random Access Memory) capacitors must remain nearly constant while their size decreases rapidly, and thus it is necessary to replace the previously used $SiO_2$ and $Si_3N_4$ with materials' which have higher permittivities than these. In optoelectronics, dielectric films having high permittivities can be exploited in, for example, electroluminence displays, in which the operating voltage of the displays can be reduced by means thereof. Some dielectric materials having high permittivities, e.g. $BaTiO_3$, are also ferroelectric materials at normal temperatures, a factor which further extends their potential uses, for example, to NVRAM (Nonvolatile Random Access Memory) and various microelectromechanical applications.

In addition to high permittivities, these dielectric thin films are required to have, among other things, low leakage current densities and high dielectric breakdown fields. The achievement of both of these properties presupposes a dense and flawless film structure. Of course, the properties of the films must be stable in the conditions of use. Furthermore, in particular in microelectronics applications, the conformality of the films, i.e. their capacity to cover surfaces of complicated shapes with a film of a uniform thickness is important, because in the manufacture of microelectronics components it is necessary to deposit films even in deep trenches and holes.

Oxide thin films containing barium and strontium are widely used and researched dielectric films having high permittivities. Important oxide thin films containing barium and strontium include, for example, $BaTiO_3$, $SrTiO_3$ and $Ba_{1-x}Sr_xTiO_3$ (x is 0–1). In addition to these there can be mentioned high-temperature superconductors, e.g. $YBa_2Cu_3O_{7-x}$ (x is 0–1), $Bi_2Sr_2Ca_{n-1}Cu_nO_{5+(2n-1)+\delta}$ and $Tl_2Ba_2Ca_{n-1}CuO_{5+(2n-1)+\delta}$, and dielectric materials lattice-matched therewith, $PrBa_2Cu_3O_{7-\delta}$ and $Sr_2AlTaO_6$ (D. L. Schulz and T. J. Marks, Advanced Materials 6 (1994) 719). In all of the above-mentioned formulae, n is 1-3 and δ is 0–1. Other oxide films containing barium and strontium include various niobates $(Sr,Ba)Nb_2O_6$ and $(Pb,Ba)Nb_2O_6$ (L. M. Shepard, Ceramic Bulletin 71 (1992) 85). These films have been manufactured by many different methods, such as the sol-gel method, various physical vapor deposition methods (PVD) (e.g. vaporization, sputtering, laser ablation) and chemical vapor deposition methods (CVD).

Films manufactured by the sol-gel method, by various physical vapor deposition methods (PVD) (e.g. vaporization, sputtering, laser ablation) and by chemical vapor deposition methods (CVD) are of a high quality. Instead, the manufacture of a film of uniform quality and thickness when the surface structure of the piece is complicated will not succeed. Only by the CVD method is it possible to deposit conformal films in deep trenches and holes (S. M. Bilodeau, Solid State Technology, July (1997) 235). Even in the CVD method, high conformality is attained only when the rate of film growth is determined by the rate of the surface reaction and not by the diffusion of the precursors on the film surface. This is achieved when the surface reaction is slower than the diffusion of the precursors on the film surface. The surface reaction is slow at low temperatures, but in such a case the other properties of the film will, however, often remain poor, which is due to both the poor crystallinity of the film and to difficulties in the control of its composition (C. S. Kang et al., Japanese Journal of Applied Physics, Part 1 36 (1997) 6946; M. Kiyotoshi and K. Eguchi, Electrochemical Society Proceedings 97-25 (1997) 1063).

Atomic Layer Epitaxy (ALE), which is also known as Atomic Layer Chemical Vapor Deposition (ALCVD) or Atomic Layer Deposition (ALD), is a known method for the deposition of thin films (U.S. Pat. No. 4,085,430). In this method, the thin film is deposited by means of alternate saturating surface reactions. These reactions are implemented by feeding gaseous or vaporized precursors into the reactor alternately and by purging the reactor with an inert gas between the precursor pulses (T. Suntola, Thin Solid Films 215 (1992) 84; Niinistö et al., Materials Science and Engineering B 41 (1996) 23). In addition, ALE can be used for depositing layers of uniform thickness even on large surfaces, and the control of the thickness and composition by means of the number of reaction cycles is precise and simple.

The ALE method has previously been used for making $TiO_2$ films (Ritala et al., Thin Solid Films 225 (1993) 288, Chemistry of Materials 5 (1993) 1174 and 6 (1994) 556), but so far it has not been possible to manufacture the barium- and strontium-containing oxide thin films which are the object of the present invention by the ALE method in a self-controlling manner. Attempts at self-controlling deposition of superconductive films have also failed. The most important reason for not manufacturing the above-mentioned compounds is the lack of suitable precursors for Ba and Sr. Few of the compounds of the said elements are volatile, and so the precursors used in both CVD and ALE have as a rule been of one compound type, i.e. β-diketonates (W. A. Wojtcak et al., Advances in Organometallic Chemistry 40 (1996) 215, Tiitta and Niinistö, Chemical Vapor Deposition 3 (1997) 167). The problem with the β-diketonates of Ba and Sr is that they do not react with the oxygen sources, $H_2O$, $H_2O_2$ and $O_2$, most typically used in the ALE method, at temperatures at which they would not decompose thermally. Iodides of the said metals have also been used in the CVD method (P. Mårtensson and A. Hårsta, Journal of Crystal Growth 156 (1995) 67), but in this case it is necessary to use temperatures which are too high for most applications.

EP application publication No. 344 352 describes a method for making laminated superconductors by an epitaxy method. The ALE method is also mentioned. The application publication also lists suitable organometallic compounds which can be used as precursors in these methods. Barium cyclopentadienyl is also among them. However, in the publication a film has not been deposited by specifically the ALE method and by using specifically barium cyclopentadienyl as the precursor. Furthermore, the EP publication does not provide preferred conditions for the film growth, since it does not state how or in what conditions cyclopentadienyl compounds should be used, how oxygen is introduced into the oxides or what advantages would follow specifically from the use of barium cyclopentadienyl as the precursor in any of the alternative epitaxy methods described in the publication.

It is an object of the present invention to eliminate the deficiencies described above and to provide a novel method for the manufacture of thin films and superconductive materials which contain barium and strontium.

The invention is based on the observation that the barium and strontium compounds according to the invention are sufficiently stable in a gas phase, and consequently these compounds can be used as precursors in the ALE technique, and thus oxide thin films which contain barium and strontium can be deposited in a controlled manner. The cyclopentadienyl compounds of barium and strontium are such vaporizable compounds. In the deposition of film, the said barium and strontium compounds are used as precursors in a method according to the ALE principle together with a reactive oxygen precursor and a volatile titanium compound.

In the technical solution according to the invention, oxide thin films are deposited in an ALE reactor at a temperature of 100-700° C., preferably 150-400° C. Either sheet-form (such as glass or silicon wafer) or pulverous materials can be used as the substrate. According to the ALE method, a cyclopentadienyl compound containing an earth-alkali metal is vaporized, whereafter the reactor is purged with an inert gas, the oxygen precursor is fed into the reactor, and the reactor is purged for a second time with an inert gas. All of these steps together constitute one deposition cycle. The deposition cycle is repeated until the film is of the desired thickness. A multi-component film is obtained by changing the precursor.

In connection with the present invention, cyclopentadienyl compounds of barium or strontium are used as precursors. By these compounds is meant any compound according to Formulae I-IV.

  (I)

  (II)

  (III)

  (IV), in which formulae

M is Ba or Sr;

Cp is a cyclopentadienyl group, the Cp groups present in Formulae I and II being mutually the same or different;

X is a ligand other than Cp, with the valency of −1;

$L_n$ is a neutral adduct ligand which binds to a metal by either one or several of its atoms, and n depicts the number of the ligands being bound.

In Formulae I-IV the cyclopentadienyl groups may also be in the same molecule. In this case the bridge between two Cp groups is made up of a substituted or unsubstituted $C_1$-$C_6$ chain, which may contain a heteroatom which is Si, N, P, Se or S.

Ligand X is preferably β-diketonate or a corresponding sulfur or nitrogen compound, halide, amide, alkoxide, carboxylate or Schiff base.

L is preferably (i) a hydrocarbon, (ii) an oxygen-containing hydrocarbon, (iii) a nitrogen-containing hydrocarbon, (iv) a sulfur-containing hydrocarbon, (v) a phosphorus-containing hydrocarbon, (vi) an arsenic-containing hydrocarbon, (vii) a selenium-containing hydrocarbon, and/or (viii) a tellurium-containing hydrocarbon.

Most preferably L is (a) an amine or a polyamine, (b) a bipyridine, (c) a ligand depicted by the formula

(V)

in which formula G is —O—, —S—, or —NR¹—, where R¹ is hydrogen or a substituted or unsubstituted, cyclic, linear or branched alkyl, alkenyl, aryl, alkylaryl, arylalkyl, alkoxy, thio, cyano or silyl group. The cyclic or aromatic ring of R¹ may contain a heteroatom. The ligand depicted by Formula V may also have either hydrogen or a substituent like R¹ attached to the carbon atoms, (d) ether or thioether.

The cyclopentadienyl group (Cp) in Formulae I-IV is of the form

 (VI), where m is an integer of 0-5,

Cp' is a fused or individual cyclopentadienyl, and

R is a hydrocarbon radical containing 1-20 carbon atoms, preferably a $C_1$-$C_6$ hydrocarbon. The R's may be mutually the same or different. R may be a substituted or unsubstituted, cyclic, linear or branched alkyl, alkenyl, aryl, alkylaryl, arylalkyl, alkoxy, thio, amino, cyano or silyl group. The cyclic or aromatic ring of the substituent may contain a heteroatom. Methyl, ethyl, propyl and isopropyl groups can be mentioned as examples of the substituents.

Preferably there is used an organometallic complex according to Formula II, where Cp is cyclopentadienyl, indenyl or fluorenyl. As the neutral adduct ligand L (Formulae II and IV) there are used, for example, ethers, amines or solvent molecules (e.g. tetrahydrofuran) which bind to the metal by one atom. Polyethers and polyamines can be mentioned as examples of suitable ligands which bind to the metal by several of their atoms.

According to the invention, the precursor used for the oxide thin film is especially preferably a THF adduct of bis(pentamethylcyclopentadienyl) or bis(triisopropylcyclopentadienyl) of barium or strontium.

According to the first preferred embodiment of the invention, the cyclopentadienyl compounds of barium and strontium are used together with a volatile titanium compound (e.g. a halide, alkoxide, cyclopentadienyl, alkylamide) and a reactive oxygen precursor (e.g. $H_2O$, $H_2O_2$), in which case $BaTiO_3$, $SrTiO_3$ and $Ba_{1-x}SR_xTiO_3$ films can be grown by the ALE method at low deposition temperatures (325° C.). The said precursors can also be exploited in ALE deposition of other oxide thin films containing barium and/or strontium.

Below there are listed titanium compounds which have vapor pressures sufficient at a temperature lower than the temperature of the deposition substrate, and which are thus suitable for use in the method according to the present invention. Thus, preferably one or more of the following compounds are used as the volatile titanium compound:

titanium halides, for example $TiCl_4$, $TiCl_3$, $TiBr_3$, $TiI_4$, $TiI_3$, titanium alkoxides, for example $Ti(OC_2H_5)_4$, $Ti(O^iPr)_4$, $Ti(O''Bu)_4$ and titanium(IV)-ethylhexoxide, titanium nitrate ($Ti(NO_3)_4$), alkylamino complexes of titanium, for example tetrakis(diethylamino)titanium, tetrakis(dimethylamino)titanium, tetrakis(ethylmethylamino)titanium, tetrakis(isopropylmethylamino)titanium, bis(cyclopentadienyl)bis(dimethylamino)titanium, tris(dimethylamino)(N,N,N'-trimethylethyldiamino)titanium, and tert-butyltris(dimethylamino)titanium; further examples of applicable compounds are described in U.S. Pat. No. 5,659,057, cyclopentadienyl complexes of titanium, for example $Ti(\eta_5\text{—}C_5H_5)_2$, $Ti(\eta^5\text{—}C_5H_5)(\eta^7\text{—}C_7H_7)$, $(\eta^5\text{—}C_5H_5)TiR_2$, where R=alkyl (e.g. $CH_3$), benzyl ($C_6H_5$) or carbonyl, bis(t-butylcyclopentadienyl)titanium dichloride, bis(pentamethylcyclopentadienyl) titanium dichloride, and $(C_5H_5)_2Ti(CO)_2$, silylamido complexes of titanium, such as $Ti\{N_4[Si(CH_3)_3]_4[Si(CH_3)_2]_2\}$; further examples of applicable compounds are described in U.S. Pat. No. 5,603,988, titaniumdialkyldithiocarbamates, and titanium-β-diketonates, for example di(i-propoxide)bis(2,2,6,6-tetramethyl-3,5-heptanedionato)titanium, and tris(2,2,6,6,-tetramethyl-3,5-heptanedionato)-titanium(III).

Especially preferably, titanium tetraisopropoxide ($Ti(O^iC_3H_7)_4$) is used.

The oxygen precursor may be any oxygen compound usable in the ALE technique. Preferable oxygen precursors include water, oxygen and hydrogen peroxide, and aqueous solutions of hydrogen peroxide. Ozone ($O_3$) is an especially preferable oxygen precursor. It is known on the basis of the literature that, if ozone is used as the precursor for oxygen, a denser layer of material is obtained from the forming oxides, and thereby the permittivity of the oxide thin film can be improved.

One or more of the following compounds may also be used as the precursor for oxygen:

oxides of nitrogen, such as $N_2O$, NO, and $NO_2$, halide-oxygen compounds, for example chlorine dioxide ($ClO_2$) and perchloric acid ($HClO_4$), the compatibility of these with earth-alkali metals being, however, limited, peracids (—O—O—H), for example perbenzoic acid ($C_6H_5COOOH$) and peracetic acid ($CH_3COOOH$), alcohols, such as methanol ($CH_3OH$) and ethanol ($CH_3CH_2OH$), and various radicals, for example oxygen radical (O..) and hydroxyl radical (.OH).

According to a second preferred embodiment, the ratio of the deposition cycles (e.g. Ti—O, Sr—O and Ba—O) producing the different binary oxides of multicomponent oxide films (e.g. $BaTiO_3$, $SrTiO_3$ and $Ba_{1-x}Sr_xTiO_3$) is controlled. If, for example, Sr/Ti is 0.8-1.2, preferably approx. 1, a crystalline film is obtained (cf. Example 1). Thus the composition can be controlled simply and with precision. In order that the composition of the film should be uniform, the deposition cycles are carried out so that the different materials become mixed as completely as possible, i.e. there will be 1-10, preferably 1-2 similar cycles in succession.

According to a third preferred embodiment, the oxide film is grown at a lower temperature (250-300° C.), whereby an amorphous thin film is obtained. The structure of the film becomes crystalline during postannealing. The postannealing is carried out at a temperature higher than the growth temperature, and its duration may vary. According to a preferred embodiment of the invention, the duration of the postannealing is 60 min, and it is carried out in an air stream at 500° C.

Considerable advantages are gained with the help of the invention. Since according to the ALE method the film grows through saturating surface reactions, the growth is self-controlling, which in turn ensures excellent conformality. As is evident from the above, cyclopentadienyl compounds of strontium and barium can be used as vaporizing components within a wide temperature range, in which case the structure of the thin film made and its crystallinity can be effectively controlled by the selection of the reaction temperature and the metal mixing ratio and by a potential post-treatment. The present precursors are especially advantageous for use in the ALE technique also for the reason that they will not leave significant carbon or hydrogen residues in the final product. On the other hand, the dielectric constants of oxide thin films containing barium and strontium are very high, and thus the oxides of specifically barium and strontium are especially suitable as materials for dielectric thin films. Owing to their high dielectric constants they are especially suitable for memory circuits and for gate oxides. By the use of cyclopentadienyl compounds of barium together with a volatile titanium compound, a low-temperature growth process is achieved, which is important in most applications of dielectric films.

In the context of the present invention, by dielectric oxide thin film is meant a thin film having a high permittivity. The permittivity varies according to the thickness of the film so that the permittivity of a thinner film is lower. It can be noted as an example that for a film approx. 50 nm thick a high permittivity is approx. 50 or more, preferably approx. 100 or more.

Thin films according to the invention are preferably used as dielectric films of various electronics components. Films according to the invention are deposited, for example, on platinum (Pt), $RuO_2$, $IrO_2$, $SrRuO_3$, $LaSrCoO_3$, $IrO_2/Ir$, $RuO_2/Pt$, silica ($SiO_2$), silicon nitride and silicon surfaces.

By means of the present invention it is possible to make, in addition to the above-mentioned thin films, also high-temperature superconductors mentioned in the preamble, for example $YBa_2Cu_3O_{7-x}$ (x is 0–1), $Bi_2Sr_2Ca_{n-1}Cu_nO_{5+(2n-1)+\delta}$ and $Tl_2Ba_2Ca_{n-1}Cu_nO_{5+(2n-1)+\delta}$, and dielectric materials lattice-matched therewith, such as $PrBa_2Cu_3O_{7-\delta}$ and $SR_2AlTaO_6$ (D. L. Schulz and T. J. Marks, Advanced Materials 6 (1994) 719).

Three examples are presented below in order to illustrate the invention.

Example 2

$SrTiO_3$ films were grown in a flow-type F-120 ALE reactor (Mikrokemia Oy) at a temperature of 325° C. The strontium precursor used was the THF adduct of bis(triisopropylcyclopentadienyl) strontium, $Sr(C_5(^iC_3H_7)_3H_2)THFG_p$, in which p=0-2 and THF is tetrahydrofuran, and which was vaporized in the reactor by heating it to a temperature of 100° C. The titanium precursor used was titanium tetraisopropoxide (Ti$(O^iC_3H_7)_4$), which was vaporized in the reactor at a temperature of 40° C. The oxygen source used was water, which was fed into the reactor from outside it. The growth of $TiO_2$ from the said precursors has been described previously (Ritala et al., Chemistry of Materials 5 (1993) 1174).

The growth of $SrTiO_3$ was implemented by using alternate Ti—O and Sr—O deposition cycles. The Ti—O cycle was made up of four steps: (i) an 0.6 s pulse of Ti($O^iC_3H_7$)$_4$, an 0.5 s purge with inert nitrogen gas, (iii) an 0.6 pulse of $H_2O$, and (iv) an 0.5 s purge with nitrogen gas. Respectively, the composition of the Sr—O cycle was: (i) an 0.6 s pulse of $Sr(C_5(^iC_3H_7)HTF_p$, (ii) an 0.5 s purge with nitrogen gas, (iii) an 0.5 s pulse of $H_2O$, and (iv) an 0.5 s purge with nitrogen gas. The composition of the film was controlled by the ratio of the Ti—O and Sr—O cycles. The alternation of the Ti—O and Sr—O cycles was implemented so that there were at maximum two similar cycles in succession. For example, the cycle ratio Ti—O/Sr—O=1:1 was achieved by repeating the cycling formula q[(Ti—O)(Sr—O)] and the ratio Ti—O/Sr—O=3:4 by means of the formula q[(Ti—O)(Sr—O)(Ti—O)(Sr—O)(Ti—O)(Sr—O)(Sr—O)], in which formulae q indicates how many times the said cycling was repeated. Thus q determines the thickness of the film.

Figure 4:
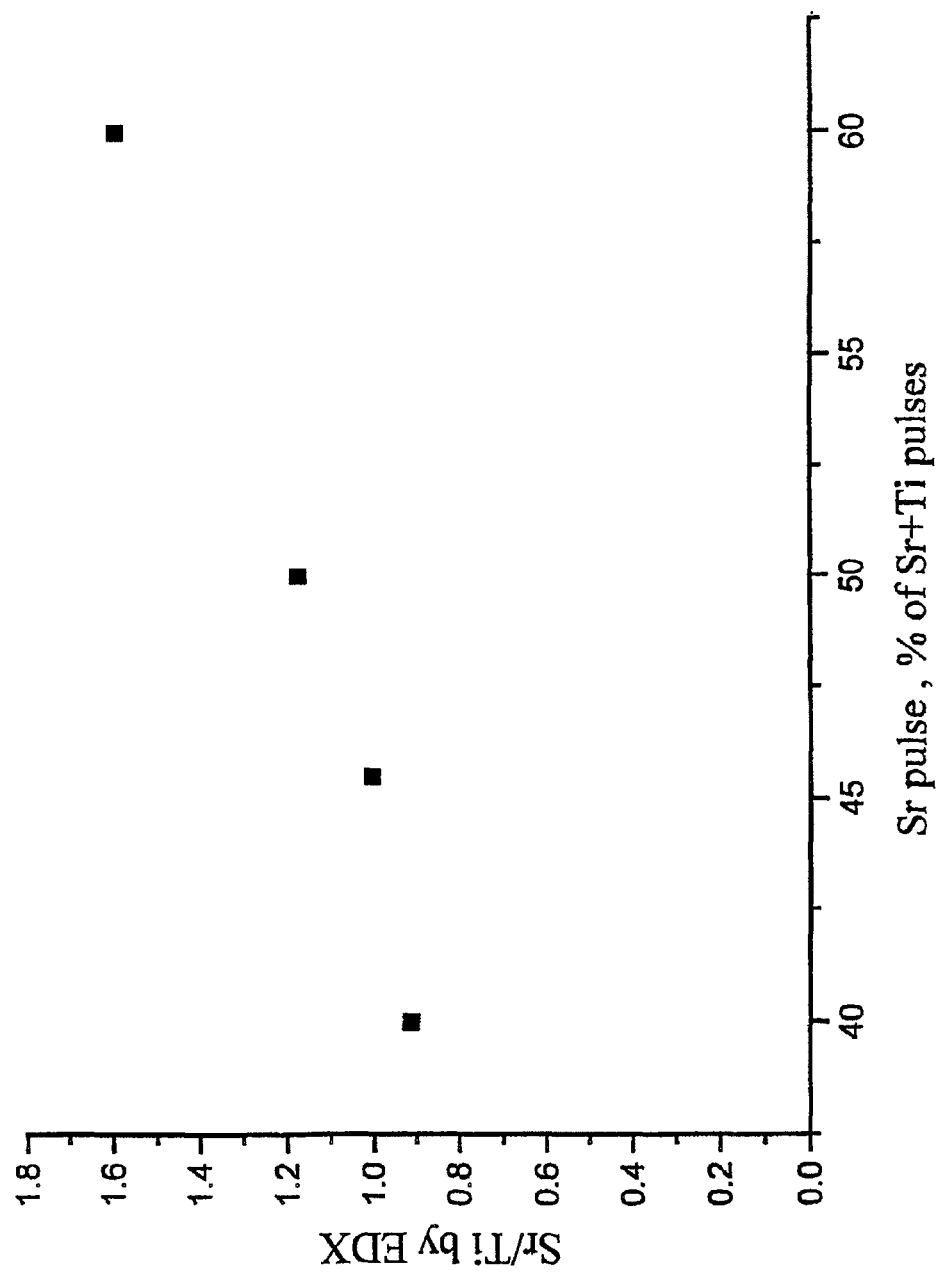
FIG. 4 depicts the composition of a multi-component film as a function of the cycle ratio of the various components.
Figure 5:
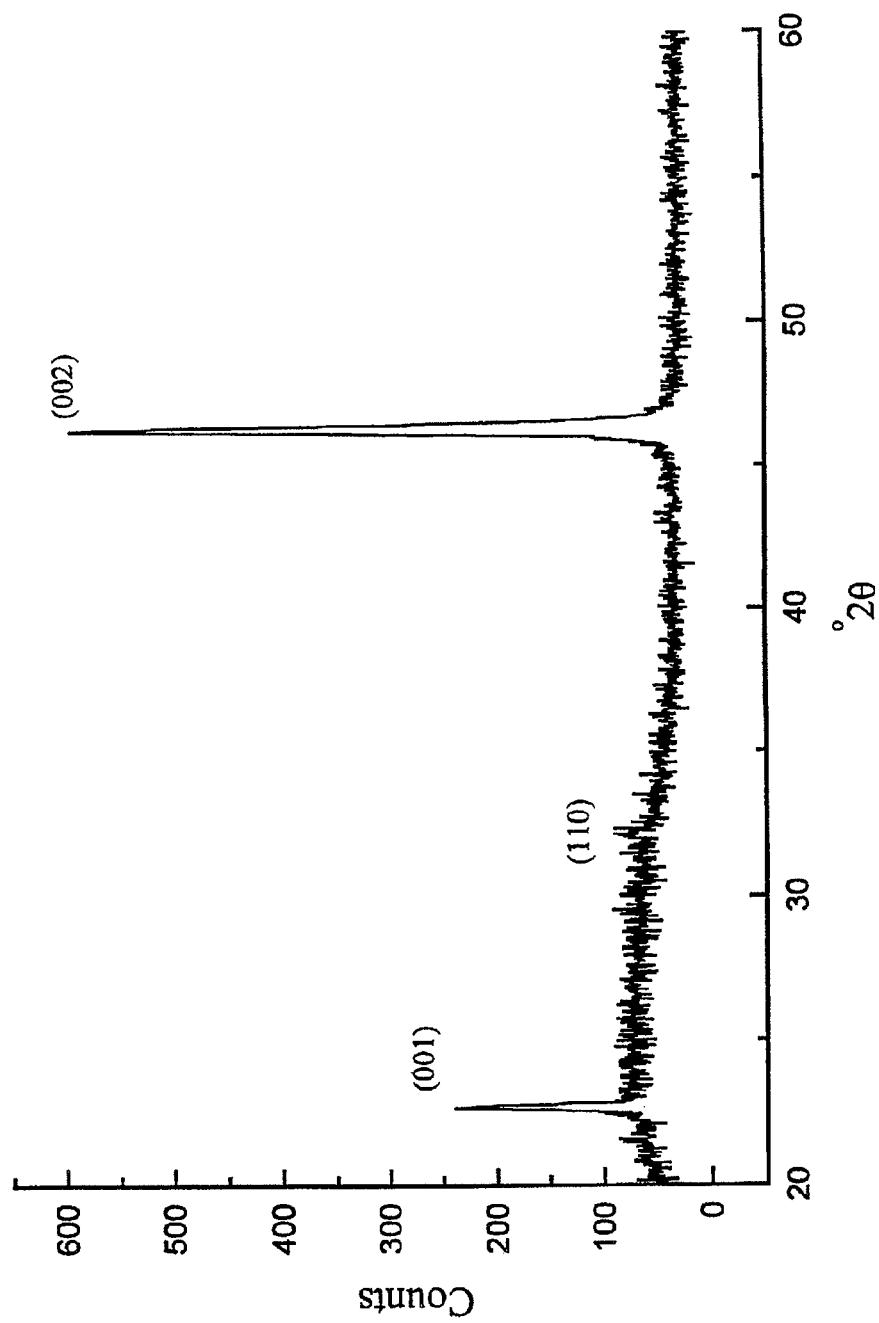
FIG. 5 depicts an X-ray diffraction analysis of the thin film.

When the films were grown at a temperature of 325° C., their composition varied according to the cycle ratio (FIG. 4). The linearity of the curve shown in the figure is an indication that the composition can well be controlled by means of the cycle ratio. Films having Sr/Ti ratios close to 1 were, according to an X-ray diffraction analysis, crystalline $SrTiO_3$ (FIG. 5). TOF-ERDA (Time-of-Flight Elastic Recoil and Detection Analysis) showed that the films contained carbon and hydrogen residues lower than 0.2 at. %, the other possible impurity residues being so low that they cannot be detected by the method concerned.

Figure 6:
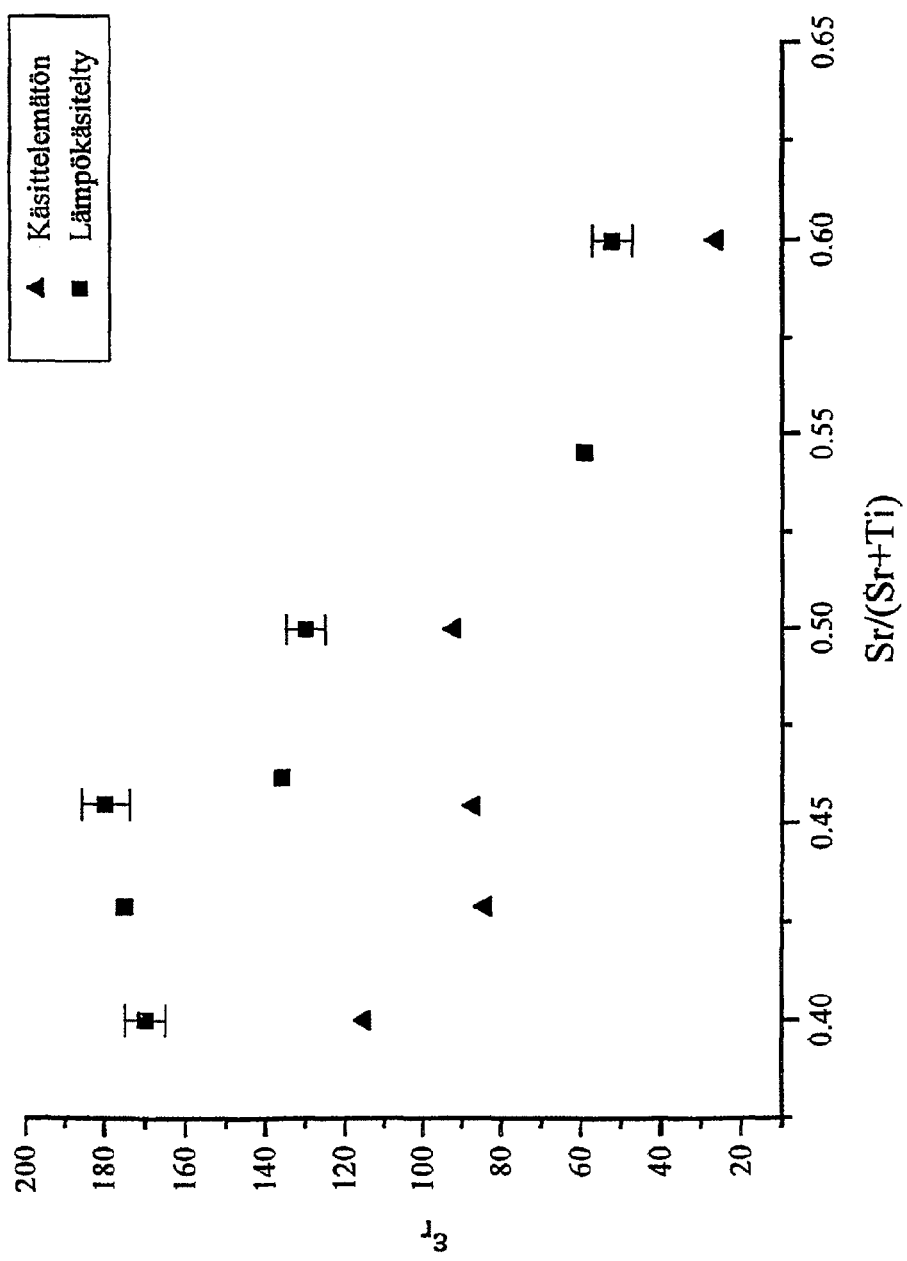
FIG. 6 depicts the permittivities of films deposited at 325° C., as a function of the cycle ratio, as measured from the structure ITO/SrTiO$_3$/Al, where ITO is indium-tin oxide.

FIG. 6 shows the effect of the post-treatment on the permittivity of the film. The permittivities of films without post-treatment are at maximum 118, but annealing in air at a temperature of 500° C. for 60 min increases permittivity significantly, the highest values being 180. The postannealing also increased the intensity of X-ray reflections, showing an improved film crystallinity.

Example 3

The process according to Example 1 was repeated using a growth temperature of 250° C. The films thus grown were amorphous, but they crystallized when they were heated in air at 500° C. for 60 min.

Example 4

$BaTiO_3$ films were grown in the manner described in Example 1, but by using instead of $Sr(C_5(^iC_3H_7)_3H_2)_2THF_p$ a THF adduct of bis-(pentamethylcyclopentadienyl)barium, $Ba(C_5(CH_3)_4)THF_p$, where x=0-2. The deposition temperature was 250° C. When a deposition cycle ratio of (Ti—O)/(Ba—O)=6:5 was used, an amorphous film was obtained. When this film was heated in air at 500° C. for 60 min, it crystallized as $BaTiO_3$, for which a measurement showed a permittivity of 165.

It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. An atomic layer deposition method for depositing a film, comprising:
   providing a substrate in a reaction space; and
   forming a metal oxide film on the substrate by repeatedly exposing the substrate to sequential and temporally separated pulses of an oxygen-containing material and a metal-containing material comprising a cyclopentadienyl group and a metal selected from the group consisting of titanium, strontium, and barium, wherein the pulses of the metal-containing material forms a layer of the metal on the substrate by a self-controlled surface reaction.

2. The method of claim 1, wherein the metal oxide film is a high dielectric constant film.

3. The method of claim 2, wherein the metal oxide film has a dielectric constant higher than $SiO_2$ and $Si_3N_4$.

4. The method of claim 1, wherein exposing the substrate to temporally separated pulses comprises alternatingly exposing the substrate to the pulses of the oxygen-containing material and the pulses of the metal-containing material.

5. The method of claim 1, wherein repeatedly exposing the substrate to sequential and temporally separated pulses further comprises exposing the substrate to pulses of one or more additional metal-containing materials, wherein the pulses of the additional metal-containing materials are temporally separated from pulses of other metal-containing materials or from pulses of the oxygen-containing material.

6. The method of claim 5, wherein exposing the substrate to pulses of one or more additional metal-containing materials comprises exposing the substrate to a titanium alkoxide.

7. The method of claim 1, wherein the metal-containing material is cyclopentadienyl barium or cyclopentadienyl strontium.

8. The method of claim 1, wherein the oxygen-containing material is selected from the group consisting of water, oxygen, hydrogen peroxide, aqueous solution of hydrogen peroxide, ozone, oxides of nitrogen, halide-oxygen compounds, peracids (—O—O—H), alcohols, oxygen-containing radicals and mixtures thereof.

9. The method of claim 1, wherein exposing the substrate to pulses of the metal-containing material deposits the metal on the substrate by surface saturating reactions.

10. The method of claim 1, further comprising removing excess reactant from the reaction space between the pulses of the oxygen-containing material and the metal-containing material.

11. The method of claim 10, wherein removing excess reactant comprises purging the reaction space with inactive gas.

12. An atomic layer deposition method for forming a film on a substrate, comprising;
    exposing the substrate to a metal precursor to self-limitingly deposit a metal-containing layer on the substrate, the metal precursor comprising a cyclopentadienyl group and a metal selected from the group consisting of barium and strontium; and
    exposing the metal-containing layer to an oxygen-containing material to form a metal oxide film.

13. The method of claim 12, wherein exposing the substrate to the metal precursor and exposing the metal-containing layer to an oxygen-containing material constitutes a cycle, further comprising performing a plurality of cycles.

14. The method of claim 13, further comprising forming a nanolaminate film by alternating a plurality of cycles with a second plurality of cycles, each of the second plurality of cycles comprising:
    exposing the substrate to a titanium alkoxide for form a titanium-containing layer on the substrate; and
    exposing the titanium-containing layer to an oxygen-containing material to form titanium oxide.

15. The method of claim 14, wherein exposing the substrate to the titanium alkoxide is performed at 150-400° C.

16. The method of claim 14, wherein the titanium alkoxide is a titanium compound comprising carbon and oxygen.

17. The method of claim 12, wherein the metal precursor is cyclopentadienyl barium or cyclopentadienyl strontium.

18. The method of claim 1, wherein exposing the metal-containing layer to an oxygen-containing material comprises exposing the metal-containing layer to an oxygen-containing material selected from the group consisting of water, oxygen, hydrogen peroxide, aqueous solution of hydrogen peroxide, ozone, oxides of nitrogen, halide-oxygen compounds, peracids (—O—O—H), alcohols, oxygen-containing radicals and mixtures thereof.

19. An atomic layer deposition method, comprising:
    depositing a layer of material on a substrate by a self-controlled surface reaction with a surface of the substrate by exposing the substrate to a metal precursor comprising a cyclopentadienyl group and a metal selected from the group consisting of strontium, barium and titanium; and
    exposing the layer of material to an oxygen-containing material reactive with the deposited monolayer, wherein the oxygen-containing material is selected from the group consisting of water, oxygen, hydrogen peroxide, aqueous solution of hydrogen peroxide, ozone, oxides of nitrogen, halide-oxygen compounds, peracids (—O—O—H), alcohols, oxygen-containing radicals and mixtures thereof.

20. The method of claim 19, wherein the metal precursor is cyclopentadienyl barium or cyclopentadienyl strontium.

21. The method of claim 19, wherein depositing the layer and exposing the layer constitute a cycle, further comprising performing a plurality of cycles.

22. A method for growing amorphous oxide thin films on a substrate in a reactor, comprising:
    producing the films by the Atomic Layer Epitaxy (ALE) process at a temperature of 150 to 400° C. by feeding pulses of precursor compounds into the reactor alternately to achieve film growth through saturating surface reactions and by purging the reactor with an inert gas between the precursor pulses to provide alternate self-limiting surface reactions on the substrate, wherein the precursor compounds comprise:
    at least one cyclopentadienyl compound containing strontium, barium or titanium; and
    a reactive oxygen precursor.

* * * * *